(12) United States Patent
Kumar et al.

(10) Patent No.: US 9,954,556 B2
(45) Date of Patent: Apr. 24, 2018

(54) SCHEME TO AVOID MISCORRECTION FOR TURBO PRODUCT CODES

(71) Applicant: SK hynix Inc., Gyeonggi-do OT (KR)

(72) Inventors: Naveen Kumar, San Jose, CA (US); Aman Bhatia, Milpitas, CA (US); Lingqi Zeng, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/049,955

(22) Filed: Feb. 22, 2016

(65) Prior Publication Data

US 2016/0248447 A1 Aug. 25, 2016

Related U.S. Application Data

(60) Provisional application No. 62/120,627, filed on Feb. 25, 2015.

(51) Int. Cl.
*H03M 13/00* (2006.01)
*H03M 13/29* (2006.01)
*H03M 13/37* (2006.01)
*H03M 13/45* (2006.01)
*H03M 13/15* (2006.01)

(52) U.S. Cl.
CPC ... *H03M 13/2963* (2013.01); *H03M 13/3707* (2013.01); *H03M 13/3746* (2013.01); *H03M 13/451* (2013.01); *H03M 13/458* (2013.01); *H03M 13/152* (2013.01)

(58) Field of Classification Search
None
See application file for complete search history.

(56) References Cited

U.S. PATENT DOCUMENTS

| 8,520,447 | B2 | 8/2013 | Yoon | |
|---|---|---|---|---|
| 8,631,306 | B2 | 1/2014 | Lee et al. | |
| 9,231,623 | B1* | 1/2016 | Kumar | H03M 13/2963 |
| 9,337,873 | B2 | 5/2016 | Marrow et al. | |
| 2005/0166121 | A1* | 7/2005 | Kaewell Jr. | H03M 13/27 714/758 |
| 2014/0129899 | A1 | 5/2014 | Kumar et al. | |
| 2015/0220391 | A1* | 8/2015 | Chilappagari | G06F 11/1048 714/764 |
| 2016/0164543 | A1* | 6/2016 | Kumar | H03M 13/2909 714/755 |
| 2016/0336969 | A1 | 11/2016 | Bhatia et al. | |

* cited by examiner

*Primary Examiner* — Daniel McMahon
(74) *Attorney, Agent, or Firm* — IP & T Group LLP

(57) ABSTRACT

The present invention discloses a memory system and operating method thereof. The major features of the memory system and the method of operating thereof are identifying a stuck error pattern including failing constituent codes and decoding the stuck error pattern. The decoding the stuck error pattern is achieved by following steps: step 1 of using possible flipping patterns for decoding the failing constituent codes, and the number of the possible flipping patterns is 2 or more in accordance with at least the number of error bits, step 2 of obtaining a number of successfully decoded codewords after using the possible flipping patterns, and step 3 of selecting the most probable codeword from the number of successfully decoded codewords.

18 Claims, 8 Drawing Sheets

SCHEME TO AVOID MISCORRECTION FOR TURBO PRODUCT CODES

CROSS-REFERENCE TO RELATED APPLICATIONS

This application claims the benefit of U.S. Provisional Application No. 62/120,627 filed Feb. 25, 2015 entitled "SCHEME TO AVOID MISCORRECTION FOR TURBO PRODUCT CODES", the entire contents of which are incorporated herein by reference.

BACKGROUND

1. Field

Exemplary embodiments of the present disclosure relate to a signal processing and coding technique.

2. Description of the Related Art

Magnetic storage technology was most commonly used for storing data, but the lower weight and faster read/write operations requirements for current electronic devices make the magnetic storage technology less desirable. The NAND-based technology is able to fulfill the demand for high density data storage devices but this technology is costly. There exists a need to lower the cost of NAND-based technology while maintaining performance levels.

SUMMARY

Aspects of the invention include methods including identifying a stuck error pattern including failing constituent codes and decoding the stuck error pattern by conducting possible flipping patterns for the failing constituent codes, obtaining a number of successfully decoded codewords after conducting the possible flipping patterns, and selecting the most probable codeword from the number of successfully decoded codewords.

Further aspects of the invention include systems that may include a post-processor for correcting data configured to conduct possible flipping patterns for failing constituent codes of a stuck error pattern, obtain a number of successfully decoded codewords after conducting the possible flipping patterns and select the most probable codeword from the number of successfully decoded codewords. The systems may also include a stuck turbo product code decoder configured to receive the data corrected by the post-processor.

Additional aspects of the invention include a memory device. The memory devices may include a controller with a post-processor configured to conduct possible flipping patterns for failing constituent codes of a stuck error pattern, obtain a number of successfully decoded codewords after conducting the possible flipping patterns, and select the most probable codeword from the number of successfully decoded codewords.

DETAILED DESCRIPTION

Figure 1:
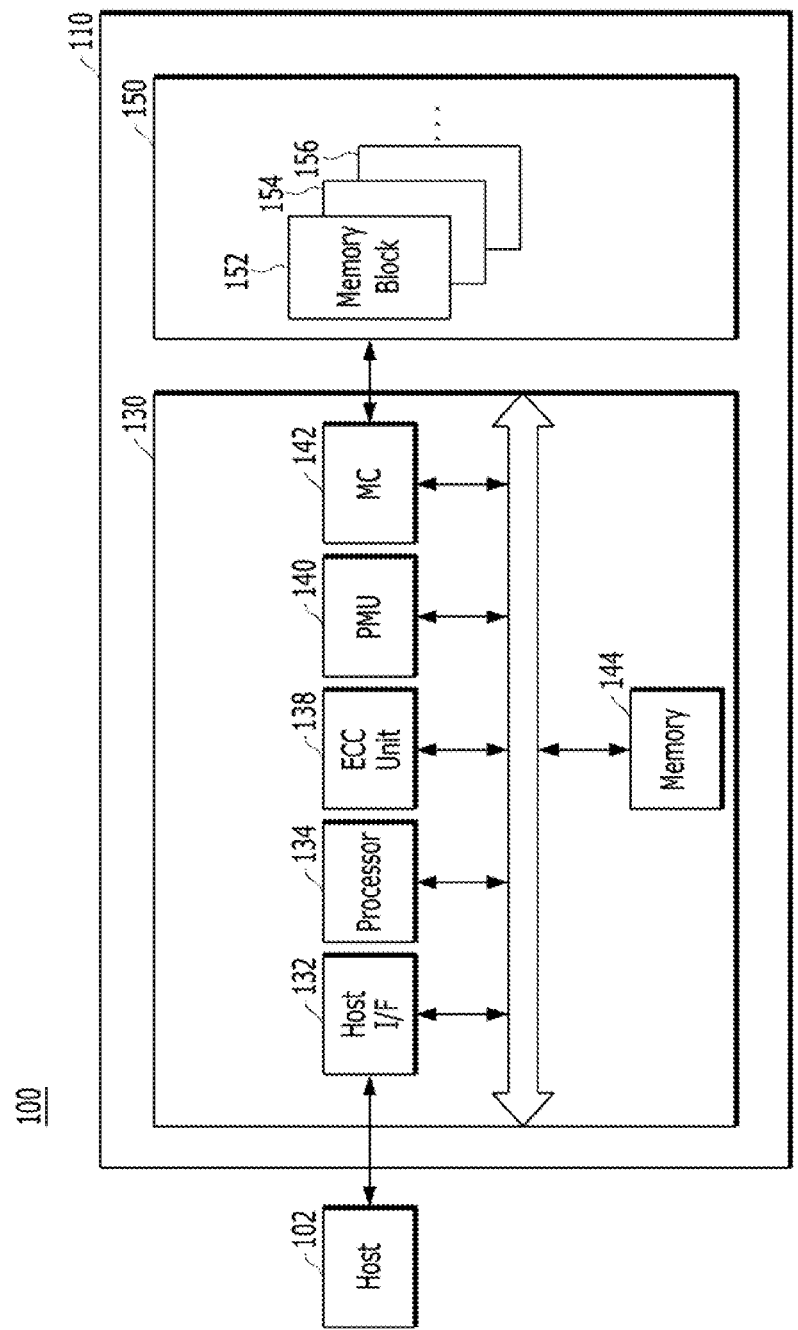
FIG. 1 illustrates a data processing system including a memory system in which embodiments of the present invention are applied.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process, data, such as computer program instructions.

One way to reduce the cost of NAND-based technology involves scaling down the process, but the scaling down process degrades the performance. This performance loss can be compensated by using advanced signal processing and coding techniques. Bose-Chaudhuri-Hocquenghem (BCH) codes and low density parity check (LDPC) codes have been used to ensure the data integrity. For BCH codes, the key drawback is that they cannot be used for soft decision decoding which makes these codes undesirable. LDPC codes provide good hard and soft decision decoding performances. The complexity of the LDPC decoder, however, is quite high, which makes this solution expensive for the hardware implementation. An advanced coding technique which can provide high performance gains with the lower hardware complexity is disclosed and described below.

A turbo product code (TPC) is considered as an advanced coding technique which can provide significant gains at much lower hardware complexity compared to LDPC codes. In hard decision decoding, TPC gives significant performance gains compared to BCH and LDPC codes. In soft decision decoding, TPC achieves performance gains close to LDPC codes.

The TPC is considered as at advanced coding technique which can provide significant gains at much lower hardware complexity compared to LDPC codes. In hard decision decoding, TPC gives significant performance gains compared to BCH and LDPC codes. In soft decision decoding TPC achieve performance gains close to LDPC codes.

For various types of storage (such as NAND-based storage), better error correction codes which can provide better performance gains with low encoding/decoding complexity are always desirable. Across data storage industries, the low density parity check (LDPC) codes and BCH codes are most commonly used for data integrity. In the past, the use of turbo product codes has been explored and it has been shown that these codes can provide significant performance gains with low encoding/decoding complexity. In turbo product codes, a miscorrection during decoding is a major concern. A miscorrection happens when the decoder decodes to a codeword which is not the correct codeword. These miscorrections on constituent codes (e.g., BCH codes) introduce more errors into the received codeword (e.g., of 4 KB size) which makes the codeword decoding unsuccessful.

If these miscorrections can be removed from the data, the codeword can be easily decoded successfully with a conventional iterative decoder. However the miscorrection avoidance without any parity overhead is quite difficult and there is no technique known which can guarantee the miscorrection avoidance for BCH codes. Techniques are described herein for avoiding miscorrection in hard decision decoding without any parity overhead. The disclosed scheme provides performance gains close to the genie miscorrection avoidance (i.e., where all information is known to the genie)

As a result, there is a need for an advanced coding technique to provide gains in terms of performance and throughput in a system using turbo product codes.

In some embodiments, the present invention will be applied to a data processing system shown in FIG. 1.

FIG. 1 illustrates a data processing system 100 including a memory system in which embodiments of the present invention are applied. The data processing system 100 shown in FIG. 1 is for illustration only. Other constructions of the data processing system 100 could be used without departing from the scope of this disclosure. Although FIG. 1 illustrates one example of the data processing system 100, various changes may be made to FIG. 1. For example, the data processing system 100 may include any of elements, or may not include any of elements in any suitable arrangement.

Referring to FIG. 1, the data processing system 100 may include a host 102 and a memory system 110.

The host 102 may include, for example, a portable electronic device such as a mobile phone, an MP3 player and a laptop computer or an electronic device such a desktop computer, a game player, a TV and a projector.

The memory system 110 may operate in response to a request from the host 102, and in particular, store data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RAM.

The memory system 110 may include a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. The controller 130 and the memory device 150 may be integrated into one semiconductor device and configure a memory card such as a Personal Computer Memory Card International Association (PCMCIA) card, a compact flash (CF) card a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra mobile PC (UMPC) a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a non-volatile memory device, for example, a flash memory. The flash memory may have a three-dimensional (3D) stack structure.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

In detail, the controller 130 may include a host interface unit 132, a processor 134, an error correction code (ECC) unit 138, a power management unit (PMU) 140, a memory controller (MC) 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The MC 142 may serve as a memory interface between the controller 130 and the memory device 150 to allow the controller 130 to control the memory device 150 in response to a request from the host 102. The MC 142 may generate control signals for the memory device 50 and process data under the control of the processor 134. When the memory device 150 is a flash memory such as a NAND flash memory, the MC 142 may generate control signals for the NAND flash memory 150 and process data under the control of the processor 134.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150 in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 110, and thus reliable bad block management is required.

Figure 2:
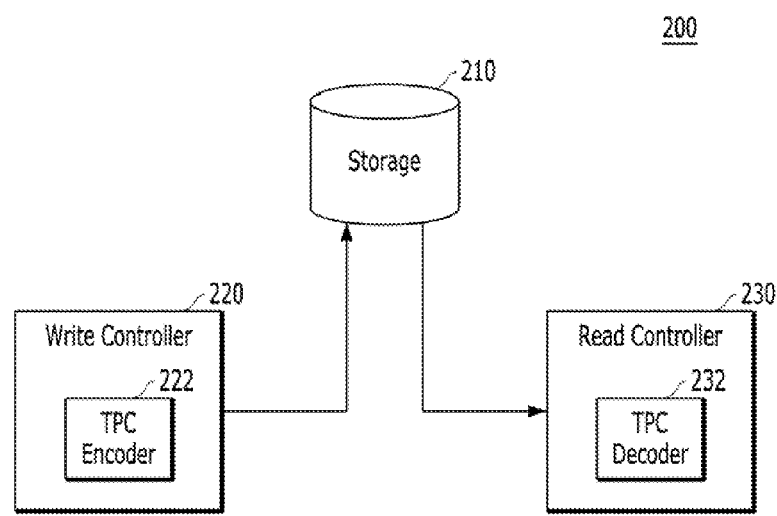
FIG. 2 is a block diagram of a memory system including an encoder and a decoder in accordance with embodiments of the present invention.

FIG. 2 is a block diagram of a memory system 200 including an encoder and a decoder in accordance with embodiments of the present invention. For example, the memory system 200 corresponds to the memory system 110 shown in FIG. 1. For clarity, components of FIG. 1 which are directly related to embodiments of the present invention are not shown herein.

Referring to FIG. 2, the memory system 200 includes a storage 210, a write controller 220 and a read controller 230. For example, the storage 210 corresponds to the memory device 150 shown in FIG. 1, and the write controller 220 and the read controller 230 correspond to the ECC unit 138 shown in FIG. 1.

The storage 210 may include solid state storage such as NAND flash. The write controller 220 receives data from host 102 in FIG. 1, and processes the data on the storage 210. The read controller 230 reads the data on the storage 210, and processes the data. The write controller 220 includes a TPC encoder 222 and the read controller 230 include a TPC decoder 232 as the components for the TPC scheme, respectively.

In embodiments described herein, the turbo product code construction uses BCH codes for constituent codes. The decoding is iterative. That is, the row constituent codes are decoded followed by column constituent codes decoding and this procedure is repeated until the codeword is successfully decoded.

Figure 3:
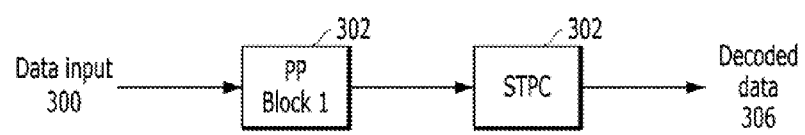
FIG. 3 is a diagram illustrating miscorrection avoidance accordance with aspects of the invention.
Figure 4:
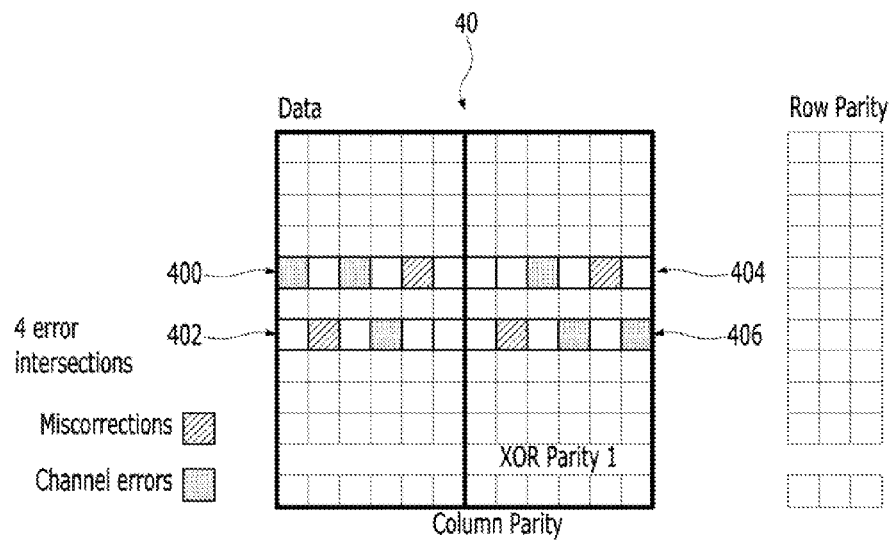
FIGS. 4, 5, 6A, 6B, and 7 illustrate examples of stuck error patterns in accordance with aspects of the invention.

FIG. 3 shows an example of a process for miscorrection avoidance. FIG. 4 shows a stuck error pattern 40 at column/row intersections 400, 402, 404, and 406. The stuck error pattern 40 shown at FIG. 4 cannot be decoded using conventional iterative decoding and gets stuck in the decoding, thus rendering an unsuccessful decoded codeword. In the examples described herein, the correction capability of row and column codewords is assumed to be 3, however, this is merely for illustration and those of skill in the art will understand that the processes and techniques disclosed herein may be utilized on codewords with other correction capability values. The stuck error pattern 40 contains miscorrections which render the decoding unsuccessful.

Referring back to FIG. 3, at 300, data is input and is sent to post-processing block 1 302 (e.g., PP block 1). The PP Block 302 may be used to decode the stuck error pattern, such as pattern 40. In the PP block 302, the error intersections (e.g., intersections 400, 402, 404, and 406) are located using failed constituent codewords information and the data bits in the intersections are compared with corresponding data bits observed from the channel. In this example, the error intersections 400, 402, 404, and 406 are the intersections for which corresponding row and column codewords are failing.

Figure 5:
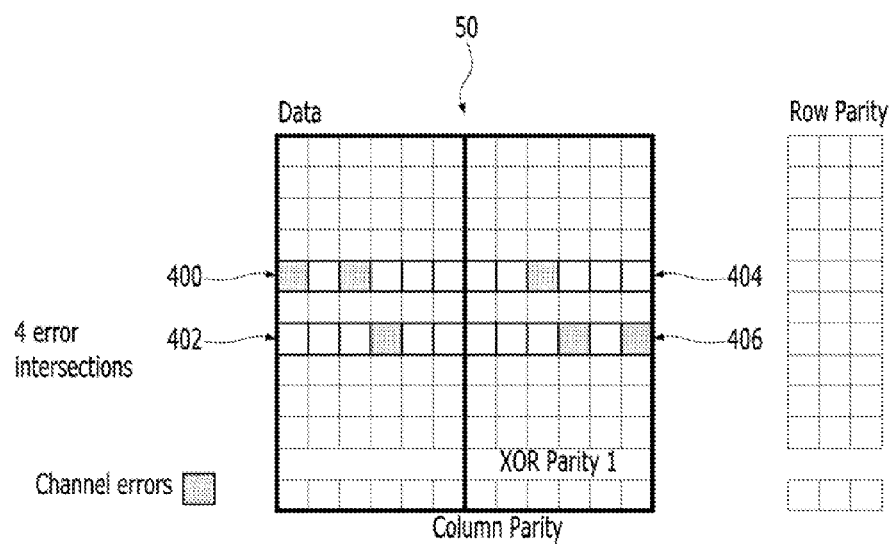

As miscorrections are introduced because of the decoder, the data 300 from the channel may be used to detect these miscorrections. These miscorrections may be further removed (e.g., such that the stuck error pattern resembles stuck error pattern 50 of FIG. 5) and the data is passed through to the stuck turbo product code (STPC) decoder 304. The error pattern 50 can be easily decoded after the removal of the miscorrections. Thus, this post-processing can be done to remove miscorrections in all row and column codewords before the corrected data is passed through the STPD decoder 304.

In a conventional decoder, each row and column constituent code is decoded in an iterative manner and the decoded data is outputted 306. In the STPD decoder 304, the failed row/column constituent codes are decoded and the corrections are made on the error intersections only (e.g., intersections 400, 402, 404, and 406).

Figure 6A:
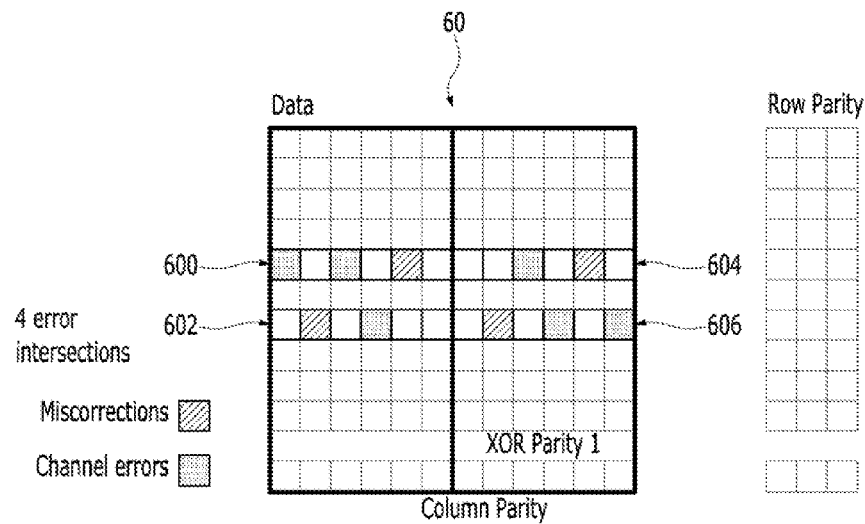
Figure 6B:
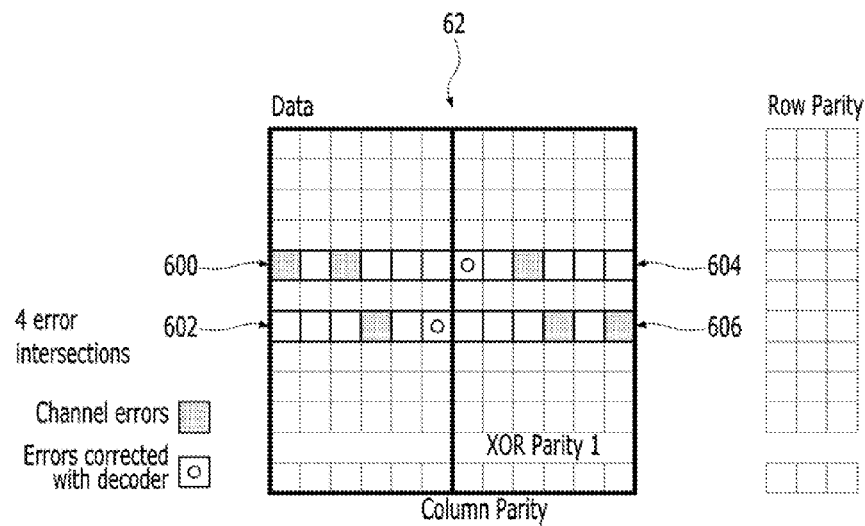
Figure 7:
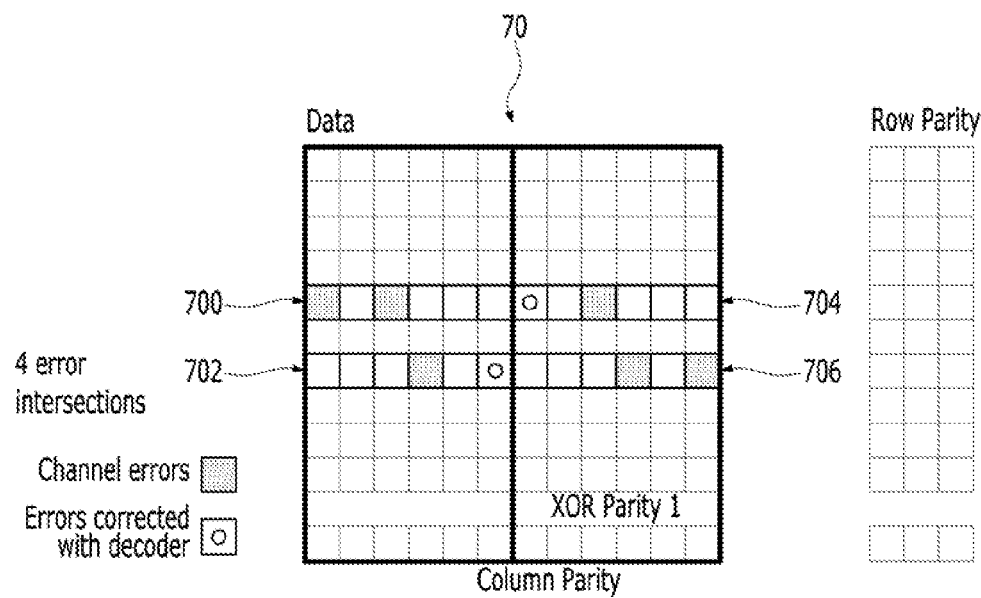

Referring next to FIGS. 6A and 6B, a stuck error pattern 60 is shown in FIG. 6A which cannot be decoded using the technique described above with respect to FIGS. 3-5. In these instances, there are some error bits in the intersections (e.g., intersections 600, 602, 604, 606) which are decoded though the decoder. The technique described above with respect to FIGS. 3-5 removes miscorrections but may introduce channel errors as shown at error pattern 62 of FIG. 6B. In 6B, the miscorrections are removed but channel errors are introduced. The pattern 70 shown in FIG. 7 cannot be decoded with the process shown at FIG. 3.

Figure 8:
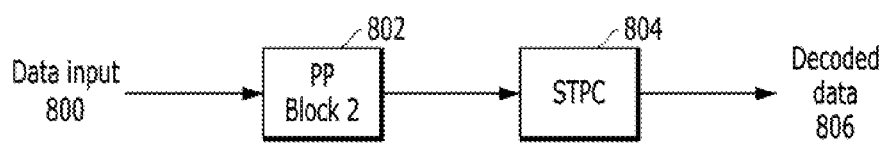
FIG. 8 is a diagram illustrating miscorrection avoidance according to aspects of the invention.

Thus, to decode patterns such as pattern 70, an alternative post processing block at FIG. 8 (e.g., PP Block 2 802) may be utilized.

In PP Block 1 302, all bits are flipped at once, thus introducing more channel errors to the stuck error pattern. However, in PP Block 2 802, a number of possible flipping patterns can be attempted for failing constituent codes. In an embodiment, all possible flipping patterns may be attempted/utilized. For example, let $n_k$ be the number of bits which are detected from the data from the channel for the kth constituent code. All possible flipping patterns ($2^{n_k}$) may be tried to decode the each failing constituent code.

Figure 9:
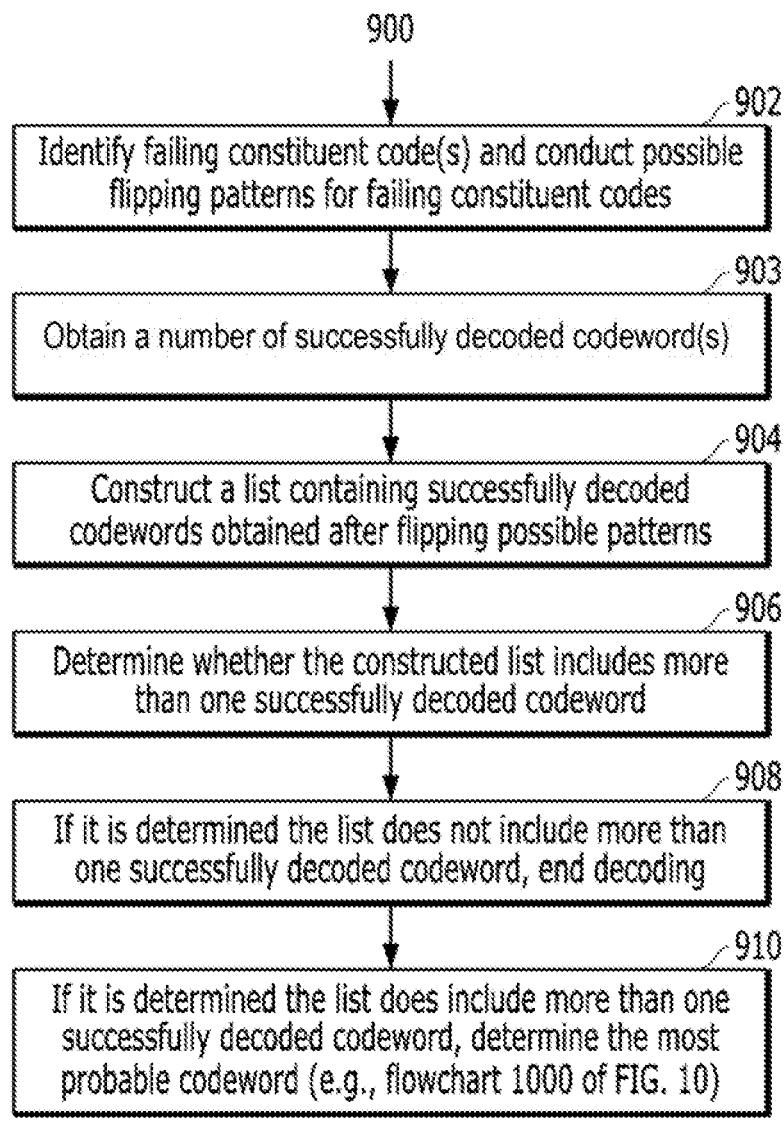
FIG. 9 is a flowchart of steps for decoding in accordance with aspects of the invention.
Figure 10:
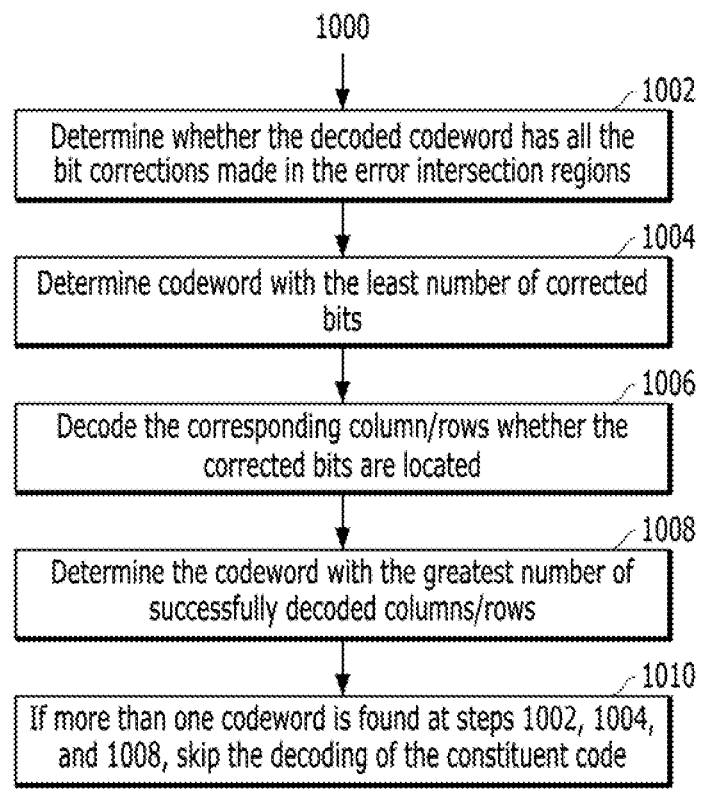
FIG. 10 is a flowchart of steps for identifying decoded codewords according to aspects of the invention.

Referring next to the methods shown in flowcharts 900 and 1000 in FIGS. 9 and 10, the functioning of the PP Block 2 802 is described. At step 902, failing constituent code(s) are identified and possible flipping patterns for the failing constituent codes are conducted. In an example, all possible flipping patterns are conducted. The step 902 may be performed by the PP Block 2 802.

At step 903 a number of successfully decoded codeword(s) is obtained. When only one successfully decoded codeword is obtained, the one obtained successfully decoded codeword may be selected as the most probable codeword, and steps 904-910 may be omitted.

At step 904, a list may be constructed that contains the successfully decoded codeword(s) obtained after the flipping at step 903. Depending on the construction of the components of the system, the construction of a list may be omitted when only one successfully decoded codeword is obtained. However, it is contemplated that the list may be constructed at step 904 regardless of the number of obtained successfully decoded codewords.

In embodiments where a list is constructed at step 904, at step 906, it is determined whether the list includes more than one successfully decoded codeword. If it is determined that the list does not include more than one successfully decoded code word (e.g., the list contains one successfully decoded codeword the list contains no successfully decoded codeword), the decoding process of PP Block 2 802 is stopped at step 908. If it is determined that the list includes more than one successfully decoded codeword, then the most probable codeword is determined at step 910.

For purposes of illustration, step 910 is further described with the flowchart 1000 of FIG. 10. When more than one successfully decoded codeword is included in the list, determining the most probable codeword and selecting the most probable codeword may be performed based on a set of predetermined criteria. The criteria described herein (e.g., steps 1002, 1004, 1006) and the order in which they are performed are exemplary and not exclusive. Those of skill in the art will understand alternative criteria and orders of these steps from the disclosure herein.

At any time during the steps in flowchart 1000, if it is determined that only one codeword meets the criteria, then that codeword may be selected as the most probable code word.

At step 1002, it is determined whether each decoded codeword has all the bit corrections made in the error intersection regions. If only one codeword satisfies the criteria of step 1002, this codeword may be selected as the most probable.

If two or more codewords have all the bit corrections made in the error intersection regions as determined at step 1002 (e.g., more than one codeword passes the first criteria), then, at step 1004, the codeword (of the codewords that passed the first criteria) with the least number of corrected bits is determined. If only one of these codewords satisfies the criteria of step 1004, his codeword may be selected as the most probable.

If two or more codewords include a number of corrected bits that is the least number among the codewords that satisfy the criteria of step 1002 (e.g., two or more codewords satisfy the criteria of 1002 and the criteria of 1004), then the corresponding columns/rows where the corrected bits are located are decoded at step 1006.

At step 1008, the codeword with the greatest number of successfully decoded column/rows from step 1006 is determined. If only one codeword with the greatest number of successfully decoded column/rows is determined at step 1008 (e.g., only one codeword satisfies the criteria of step 1002, 1004 and 1008), this codeword is selected as the most probable codeword. In some examples, the greatest number of successfully decoded column/rows is set as a maximum possible number of successfully decoded column/rows.

At step 1010, if more than one codeword satisfies the criteria of steps 1002, 1004, and 1008, then the decoding of the constituent code may be skipped.

In most cases, performing step 1002 is sufficient to determine the most probable codeword, meaning that there is only one codeword after bit flipping which has corrections on the error intersections. The PP Block 2 802 processes all failed row/constituent codes and passes the corrected data to the STPC decoder 804 for decoded data output 806.

Figure 11:
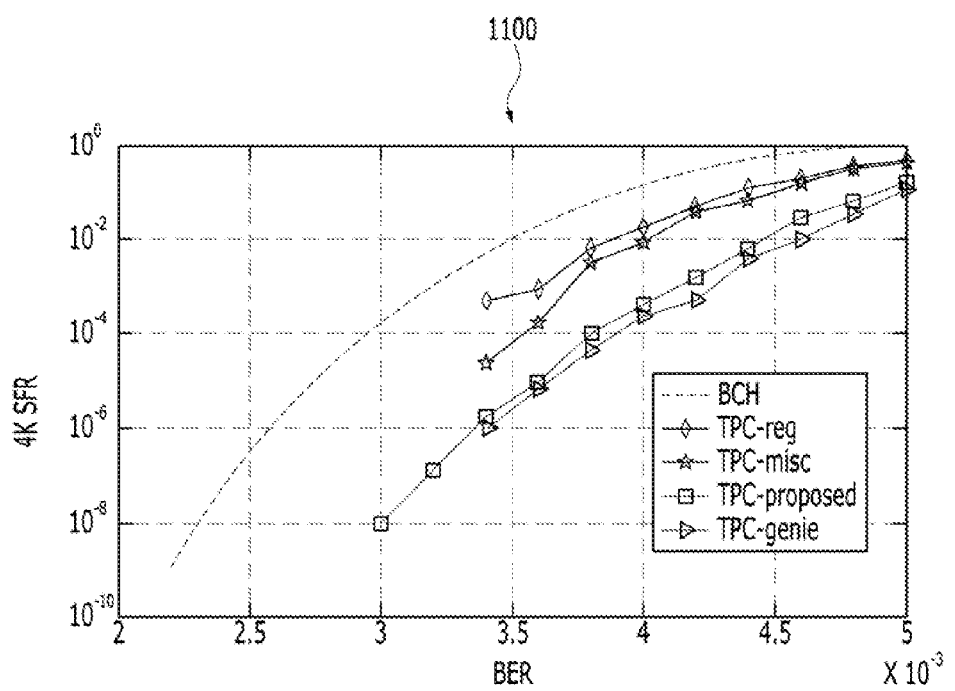
FIG. 11 is a graph illustrating the performance of the disclosed miscorrection avoidance schemes according to aspects of the invention.

FIG. 11 is a chart 1100 showing performance of the processes disclosed herein. The performance of the disclosed processes is close to the genie miscorrection avoidance. Advantageously, the performance gains are achieved without any extra parity overhead.

While the present invention has been particularly shown and described with reference to exemplary embodiments thereof, it will be understood by those of ordinary skill in the art that various changes in form and details may be made therein without departing from the spirit and scope of the present invention as defined by the following claims. Thus, the foregoing is by way of example only and is not intended to be limiting. For example, any numbers of elements illustrated and described herein are by way of example only. The present invention is limited only as defined in the following claims and equivalents thereof.

What is claimed is:

1. A method of operating a memory system including a controller and a memory device coupled with the controller, comprising:
   receiving data, by the controller, from the memory device, wherein the controller includes an ECC unit;
   detecting errors in the received data by the ECC unit;
   identifying a stuck error pattern including failing constituent codes in the detected errors by the ECC unit; and
   decoding the stuck error pattern by the ECC unit, including:
      using possible flipping patterns for decoding the failing constituent codes, wherein the number of the possible flipping patterns is $2^{n_k}$ in accordance with at least the number of error bits n of kth failing constituent code;
      obtaining a number of successfully decoded codewords after using the possible flipping patterns, and
      selecting the most probable codeword from the number of successfully decoded codewords.

2. The method of claim 1, wherein the using possible flipping patterns includes using all possible flipping patterns for decoding each of the failing constituent codes.

3. The method of claim 1, wherein the number of successfully decoded codewords obtained is equal to one.

4. The method of claim 1, wherein the selecting step includes:
   determining a codeword that satisfies a predetermined number of criteria as the most probable codeword.

5. The method of claim 4, wherein the criteria include at least one of having all bit corrections made in error intersection regions, having a least number of corrected bits, and having a greatest number of successfully decoded column/rows.

6. The method of claim 4, further comprising skipping decoding of the constituent codes when the predetermined number of criteria are not satisfied.

7. The method of claim 1, further comprising constructing a list including the number of successfully decoded codewords.

8. A memory system, comprising:
   a post-processor for correcting data;
   a non-transitory computer readable storage medium coupled to the post-processor, embedding computer program product executed by the post-processor, and including computer instructions configured to:
   control memory devices;
   receive data, by the controller, from a memory device, wherein the controller includes an ECC unit;
   detect errors in the received data by the ECC unit;
   identify a stuck error pattern including failing constituent codes in the detected errors by the ECC unit;
   use possible flipping patterns for decoding failing constituent codes of the stuck error pattern, wherein the number of the possible flipping patterns is $2^{n_k}$ in accordance with at least the number of error bits n of kth failing constituent code;
   obtain a number of successfully decoded codewords after using the possible flipping patterns; and
   select the most probable codeword from the number of successfully decoded codewords; and
   a stuck turbo product code decoder configured to receive the data corrected by the post-processor.

9. The memory system of claim 8, wherein the post-processor is further configured to use all possible flipping patterns for decoding each of the failing constituent codes.

10. The memory system of claim 8, wherein the number of successfully decoded codewords obtained is equal to one.

11. The memory system of claim 8, wherein the post-processor is further configured to select the most probable codeword from the number of successfully decoded codewords by determining a codeword that satisfies a predetermined number of criteria as the most probable codeword.

12. The memory system of claim 11, wherein the criteria include at least one of having all bit corrections made in error intersection regions, having a least number of corrected bits, and having a greatest number of successfully decoded column/rows.

13. The memory system of claim 11, wherein the post-processor is further configured to skip decoding of the constituent codes when the predetermined number of criteria are not satisfied.

14. The memory system of claim 8, wherein the controller is further configured to construct a list including the number of successfully decoded codewords.

15. An apparatus of a memory system, comprising:
   memory devices; and
   a controller coupled with the memory devices, configured to:
   receive data, by the controller, from at least one of the memory devices, wherein the controller includes an ECC unit;
   detect errors in the received data by the ECC unit;
   identify a stuck error pattern including failing constituent codes in the detected errors by the ECC unit;
   use possible flipping patterns for decoding failing constituent codes of the stuck error pattern, wherein the number of the possible flipping patterns is $2^{n_k}$ in accordance with at least the number of error bits n of kth failing constituent code;
   obtain a number of successfully decoded codewords after using the possible flipping patterns; and
   select the most probable codeword from the number of successfully decoded codewords.

16. The apparatus of claim 15, wherein the controller is configured to select the most probable codeword from the number of successfully decoded codewords by determining a codeword that satisfies a predetermined number of criteria as the most probable codeword.

17. The apparatus of claim 16, wherein the criteria include at least one of having all bit corrections made in error intersection regions, having a least number of corrected bits, and having a greatest number of successfully decoded column/rows.

18. The apparatus of claim 16, wherein the controller is configured to skip decoding of the constituent codes when the predetermined number of criteria are not satisfied.

* * * * *